(12) United States Patent
Yun et al.

(10) Patent No.: US 12,101,977 B2
(45) Date of Patent: Sep. 24, 2024

(54) DISPLAY APPARATUS INCLUDING CONNECTION WIRES HAVING BRANCHES AND MANUFACTURING METHOD THEREOF

(71) Applicant: SAMSUNG DISPLAY CO., LTD., Yongin-si (KR)

(72) Inventors: Jonghyun Yun, Yongin-si (KR); Junyoung Kim, Yongin-si (KR); Minjeong Park, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/116,564

(22) Filed: Mar. 2, 2023

(65) Prior Publication Data

US 2023/0209939 A1 Jun. 29, 2023

Related U.S. Application Data

(62) Division of application No. 16/864,305, filed on May 1, 2020, now Pat. No. 11,626,464.

(30) Foreign Application Priority Data

Aug. 7, 2019 (KR) .......................... 10-2019-0096324

(51) Int. Cl.
*H10K 59/131* (2023.01)
*H10K 59/121* (2023.01)
(Continued)

(52) U.S. Cl.
CPC ....... *H10K 59/131* (2023.02); *H10K 59/1213* (2023.02); *H10K 59/1216* (2023.02);
(Continued)

(58) Field of Classification Search
CPC ............. H10K 59/131; H10K 59/1213; H10K 59/1216; H10K 59/1201; H10K 71/00;
(Continued)

(56) References Cited

U.S. PATENT DOCUMENTS 8,465,992 B2 6/2013 Kim et al.
9,623,633 B2 4/2017 Kim et al.
(Continued)

FOREIGN PATENT DOCUMENTS

KR 10-2005-0062692 6/2005
KR 10-2006-0110200 10/2006
(Continued)

*Primary Examiner* — Nduka E Ojeh
*Assistant Examiner* — Laura M Dykes
(74) *Attorney, Agent, or Firm* — F. CHAU & ASSOCIATES, LLC

(57) ABSTRACT

A display apparatus includes a substrate comprising a display area and a pad area located outside the display area. A plurality of data lines is in the display area. A plurality of connection wires is in the display area. The plurality of connection wires is connected to the plurality of data lines and is configured to transfer data signals from the pad area to the plurality of data lines. An insulating film covers the plurality of connection wires. Each of the plurality of connection wires comprises a plurality of branches that diverge from a body of each connection wire the insulating film comprises a protrusion in a gap between adjacent branches of the plurality of branches.

10 Claims, 14 Drawing Sheets

(51) Int. Cl.
*H01L 27/12* (2006.01)
*H10K 59/12* (2023.01)

(52) U.S. Cl.
CPC ........ *H01L 27/124* (2013.01); *H01L 27/1255* (2013.01); *H01L 27/1259* (2013.01); *H10K 59/1201* (2023.02)

(58) Field of Classification Search
CPC .......................... H01L 27/124; H01L 27/1255; H01L 27/1259
USPC .......................................................... 257/773
See application file for complete search history.

(56) References Cited

U.S. PATENT DOCUMENTS

| | | |
|---|---|---|
| 10,431,604 B2 | 10/2019 | Cho et al. |
| 2006/0232738 A1 | 10/2006 | Lin et al. |
| 2017/0288007 A1* | 10/2017 | Shin ....................... H10K 71/00 |
| 2017/0337873 A1 | 11/2017 | Kim et al. |
| 2019/0088733 A1 | 3/2019 | Cho et al. |
| 2019/0121207 A1* | 4/2019 | Xian ................. G02F 1/136213 |
| 2019/0304999 A1 | 10/2019 | Wang et al. |
| 2019/0319076 A1 | 10/2019 | Lee et al. |
| 2020/0258969 A1 | 8/2020 | Yi et al. |
| 2020/0312938 A1 | 10/2020 | Okabe et al. |
| 2021/0005697 A1 | 1/2021 | Kang et al. |
| 2021/0043710 A1 | 2/2021 | Yun et al. |
| 2021/0273035 A1 | 9/2021 | Cho et al. |

FOREIGN PATENT DOCUMENTS

| | | |
|---|---|---|
| KR | 10-2012-0042151 | 5/2012 |
| KR | 10-1149433 | 5/2012 |
| KR | 10-2017-0131762 | 11/2017 |
| KR | 10-2018-0125061 | 11/2018 |
| KR | 10-2019-0032711 | 3/2019 |

* cited by examiner

DISPLAY APPARATUS INCLUDING CONNECTION WIRES HAVING BRANCHES AND MANUFACTURING METHOD THEREOF

CROSS-REFERENCE TO RELATED APPLICATIONS

This application is a divisional of U.S. patent application Ser. No. 16/864,305 filed on May 1, 2020, which claims priority under 35 U.S.C. § 119 to Korean Patent Application No. 10-2019-0096324, filed on Aug. 7, 2019 in the Korean intellectual Property Office, the disclosures of which are incorporated by reference in their entireties herein.

TECHNICAL FIELD

One or more embodiments relate to a display apparatus.

DISCUSSION OF RELATED ART

There have been rapid developments in the field of displays for visually representing various types of electrical signal information. For example, various flat panel display apparatuses have been introduced which provide desired characteristics, such as being thin, lightweight and have a low power consumption. Recently, display apparatuses have been introduced that provide an increased display area and a corresponding reduction of the dead zone due to the removal of physical buttons or other elements from the surface of the display apparatus.

SUMMARY

One or more exemplary embodiments include a display apparatus having a decreased dead zone.

According to one or more exemplary embodiments, a display apparatus includes a substrate comprising a display area and a pad area located outside the display area. A plurality of data lines is in the display area. A plurality of connection wires is in the display area. The plurality of connection wires is connected to the plurality of data lines and is configured to transfer data signals from the pad area to the plurality of data lines. An insulating film covers the plurality of connection wires. Each of the plurality of connection wires comprises a. plurality of branches that diverge from a body of each connection wire. The insulating film comprises a protrusion in a gap between adjacent branches of the plurality of branches.

The plurality of connection wires may be arranged in parallel, wherein the gap may include a distance by which ends of a pair of branches protruding toward each other from two adjacent connection wires from among the plurality of connection wires are spaced apart.

The plurality of data lines and the plurality of connection wires may be arranged on different layers from each other.

The plurality of connection wires may be arranged on one side of the display area, wherein, on the other side of the display area, a plurality of dummy wires may be arranged on the same layer as the plurality of connection wires.

The plurality of connection wires may include a U-shape, and the plurality of dummy wires may include a straight-line shape.

The display apparatus may further include a metal layer covering the protrusion.

A region of the insulating film including the protrusion may be about 1.5 times to about 2.5 times as thick as a region of the insulating film including no protrusion.

The gap between the plurality of branches may be arranged in a regular pattern, wherein the protrusion may correspond to the gap arranged in the regular pattern.

The gap between the plurality of branches may be arranged in an irregular random pattern, wherein the protrusion may correspond to the gap arranged in the random pattern.

The protrusion may be further arranged on a portion of the insulating film corresponding to the body of the connection wire adjacent to the gap.

According to one or more exemplary embodiments, a method of manufacturing a display apparatus includes forming a plurality of data lines in a display area on a substrate. A plurality of connection wires is formed in the display area. The plurality of connection wires is connected to the plurality of data lines. The plurality of connection wires is covered with an insulating film. Each of the plurality of connection wires comprises a plurality of branches that diverge from a body of each connection wire. The insulating film comprises a protrusion in a gap between adjacent branches of the plurality of branches.

The plurality of connection wires may be arranged in parallel, wherein the gap may include a distance by which ends of a pair of branches protruding toward each other from two adjacent connection wires from among the plurality of connection wires are spaced apart.

The plurality of data lines and the plurality of connection wires may be arranged on different layers from each other.

The plurality of connection wires may be arranged on one side of the display area, wherein, on the other side of the display area, a plurality of dummy wires may be arranged on the same layer as the plurality of connection wires.

The plurality of connection wires may include a U-shape, and the plurality of dummy wires may include a straight-line shape.

The method may further include covering the protrusion with a metal layer.

A region of the insulating film including the protrusion may be about 1.5 times to about 2.5 times as thick as a region of the insulating film including no protrusion.

The gap between the plurality of branches may be arranged in a regular pattern, wherein the protrusion may correspond to the gap arranged in the regular pattern.

The gap between the plurality of branches may be arranged in an irregular random pattern, wherein the protrusion may correspond to the gap arranged in the random pattern.

The protrusion may be further arranged on a portion of the insulating film corresponding to the body of the connection wire adjacent to the gap.

In another exemplary embodiment, a display apparatus includes a substrate comprising a display area and a pad area located outside the display area. A plurality of data lines is in the display area on a first layer. A plurality of connection wires is in the display area on a second layer. The plurality of connection wires includes a first area in which the connection wires extend in a first direction and include branches that extend in a second direction that is perpendicular to the first direction. The plurality of connection wires also includes a second. area in which the connection wires extend in the second direction and include branches that extend in the first direction. An insulating film covers the plurality of connection wires. The insulating film comprises a protrusion in a gap between adjacent branches of the plurality of connection wires.

Additional aspects, features, and advantages will become apparent from the accompanying drawings, the appended claims, and the detailed description.

DETAILED DESCRIPTION OF THE EXEMPLARY EMBODIMENTS

Figure 1:
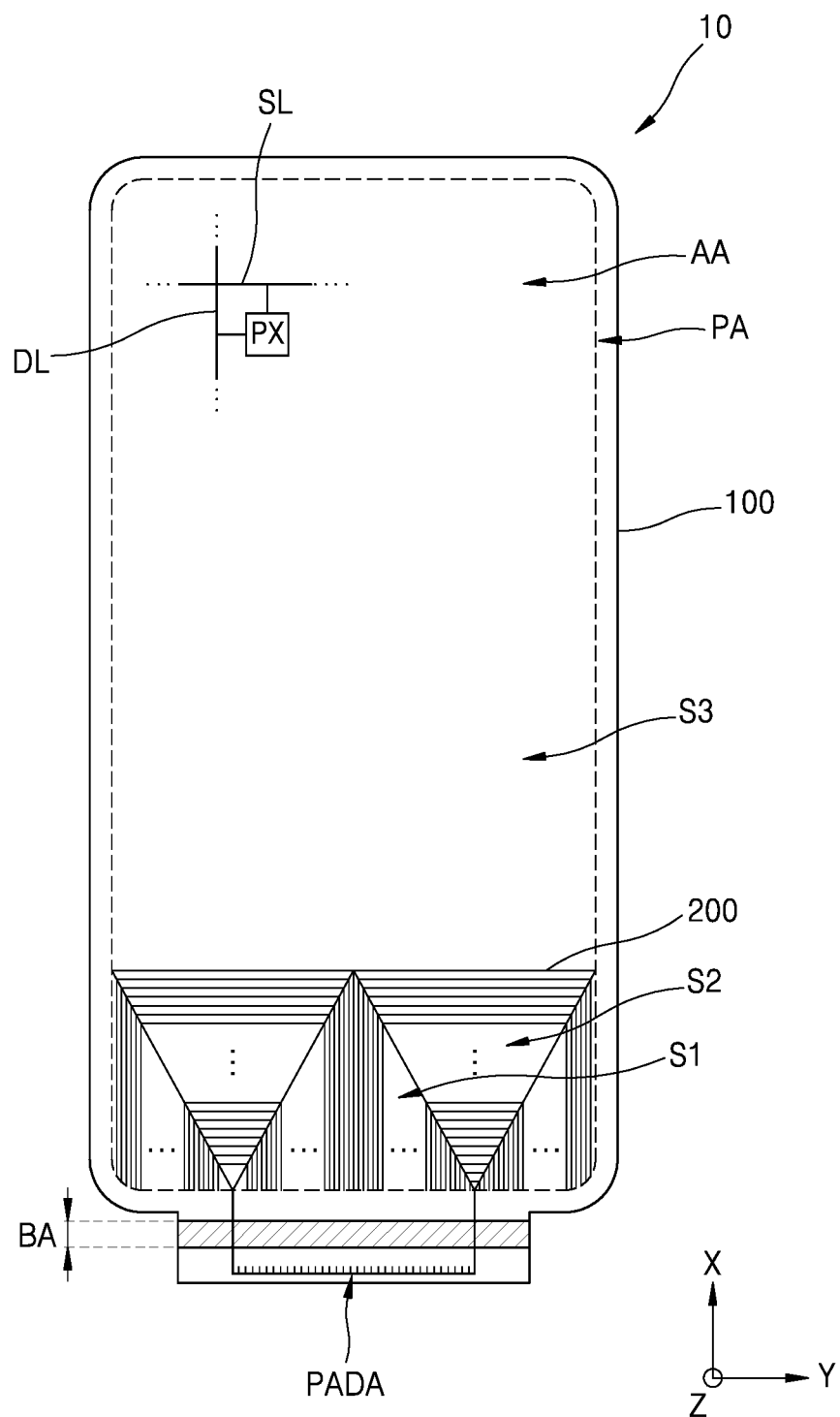
FIG. 1 is a top plan view showing a display apparatus according to an exemplary embodiment of the present inventive concepts.

Reference will now be made in detail to embodiments, examples of which are illustrated in the accompanying drawings, wherein like reference numerals refer to like elements throughout. In this regard, the present exemplary embodiments may have different forms and should not be construed as being limited to the descriptions set forth herein. Accordingly, the exemplary embodiments are merely described below, by referring to the figures, to explain aspects of the present inventive concepts. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

While such terms as "first" and "second" may be used to describe various components, such components are not limited to the above terms. The above terms are used only to distinguish one component from another.

The singular forms "a," "an," and "the" as used herein are intended to include the plural forms as well, unless the context clearly indicates otherwise.

It will be understood that the terms "comprise," "include," and "have" as used herein specify the presence of stated features or components, but do not preclude the presence or addition of one or more other features or components.

Sizes of components in the drawings may be exaggerated or reduced for convenience of explanation and exemplary embodiments of the present inventive concepts are not limited thereto.

Hereinafter, exemplary embodiments will be described in detail with reference to the accompanying drawings, wherein like reference numerals refer to like elements throughout.

FIG. 1 is a top plan view showing a display apparatus 10 according to an exemplary embodiment of the present inventive concepts.

Referring to FIG. 1, the display apparatus 10 according to an exemplary embodiment of the present inventive concepts includes a substrate 100 having a display area AA for displaying an image and a peripheral area PA located outside of the display area AA. For example, the peripheral area may be located outside of the display area AA in a first direction X (hereinafter, the "X direction") and/or a second direction Y (hereinafter, the "Y direction") which is orthogonal to the X direction.

The display area AA may include a plurality of pixels PX and wires capable of transferring electrical signals to the plurality of pixels PX.

Each of the plurality of pixels PX may include a light-emitting device and a circuit portion for driving the light-emitting device. For example, in an exemplary embodiment, the light-emitting device may be an organic light-emitting device and the circuit portion may include a plurality of transistors, a capacitor, etc. However, exemplary embodiments of the present inventive concepts are not limited thereto and the light-emitting device may be various other light-emitting devices known in the art.

The wires that may transfer electrical signals to the plurality of pixels PX may include a plurality of scan lines SL, a plurality of data lines DL, etc. In an exemplary embodiment, the plurality of scan lines SL may be arranged in a plurality of rows (e.g., arranged in the X direction and extending in the Y direction) to transfer scan signals to the pixels PX. The plurality of data lines DL may be arranged in a plurality of columns (e.g., arranged in the Y direction and extending in the X direction) to transfer data signals to the pixels PX. The plurality of pixels PX may be located at portions where the plurality of scan lines SL and the plurality of data lines DL intersect each other.

Connection wires 200 for transferring electrical signals supplied from a pad area PADA to wires connected to the pixels PX may be located in the display area AA. For example, the connection wires 200 may be connected to the data lines DL to transfer data signals supplied. from the pad area PADA to the data. lines DL. In an exemplary embodiment, the connection wires 200 and the data lines DL may be arranged on different layers from each other and be connected to each other via a contact hole as will be described later with reference to FIG. 2.

A side of the display area AA adjacent to the pad area PADA may have a width (e.g., length in the Y direction) that is greater than the width of the pad area PADA. For example, the bottom side of the display panel that extends in the Y direction in the exemplary embodiment of FIG. 1 may have a width that is greater than the width of the pad area PADA.

The connection wires 200 have to spread out wide to correspond to the side of the display area AA adjacent to the pad area. PADA. Therefore, the connection wires 200, as shown in FIG. 1, may extend in the X direction away from the pad area PADA and may then bend in the Y direction to extend toward the edge of the display area AA. The connection wires 200 may then bend again in the X direction back toward the pad area. Accordingly, the connection wires 200 may extend in a general U-shape. Therefore, data signals supplied at a central portion (e.g., in the Y direction) of the side of the display area. AA adjacent the pad area PADA may be transmitted to the data lines DL near an end portion (e.g., in the Y direction) of the side of the display area AA adjacent the pad area. Since the connection wires 200 are within the display area AA, an area of the peripheral area PA may decrease compared to the related art in which fan-out wires corresponding to the connection wires 200 are located in the peripheral area PA. Therefore, a dead zone of the display apparatus 10 may be reduced.

The display area AA may be divided into a plurality of areas according to extension directions of the connection wires 200. For example, the display area AA may include a first area S1 in the region where the connection wires 200 extend in the X direction. The display area AA may further include a second area S2 in the region where the connection wires 200 extend in the Y direction, A third area S3 may comprise the remaining region of the display area AA that does not include the first area S1 and the second area S2.

The display area AA may include a plurality of first areas S1 and second areas S2. In the exemplary embodiment shown in FIG. 1, the first area S1 and the second area S2 may each have a triangular shape. The first areas S1 may have an uptight triangular shape whereas the second area S2 may have an inverted triangular shape. However, exemplary embodiments of the present inventive concepts are not limited thereto. To prevent a short circuit between the connection wires 200, an extension length of the connection wires 200 extending in the X direction in the middle (e.g., in the Y direction of the first area S1 may be greater than the extension length of the connection wires 200 extending in the first direction X near the edge of the first area S1 (e.g., in the Y direction). Therefore, an overall shape of the first area S1 may be a triangle. Since the connection wires 200 bend from the center (e.g., in the Y direction) of the first area. S1 and extend in the Y direction, the shape of second areas S2 located on both sides of the first area S1 may each be an inverted triangle. Since the connection wires 200 bend again from the second areas S2 and extend in the X direction in the first areas S1 located outside the second areas S2, the first areas S1 may have a triangular shape.

Since extension directions of the connection wires 200 are different in the first area. S1 (e.g., which extend in the X direction) and the second area S2 (e.g., which extend in the Y direction), the reflection characteristics of the connection wires in the first area S1 and the second area S2 may be different from each other. The differences in the reflection characteristics between the first area S1 and the second area S2 may result in the first area S1 and the second area S2 being visible to a user. To prevent the visibility of the first area S1 and the second area S2, the connection wires 200 may include a plurality of branches 211 (refer to FIG. 3) that extend in directions perpendicular to the longitudinal extending directions of the connection wires 200. For example, the branches 211 for the connection wires in the first area S1 may extend in the Y direction and branches for the connection wires in the second area S2 may extend in the X direction. Therefore, the first area. S1 and the second area S2 may include identical or similar patterns, which decreasing a difference in reflection characteristics between the first area S1 and the second area S2. Additionally, dummy wires 230 (refer to FIG. 2) extending in a straight-line shape in the Y direction may be arranged in the third area S3. The dummy wires prevents the connection wires 200 from being visible due to a significant difference in reflection conditions, such as in instances in which connection wires 200 are on o side of the display area AA, and the other side is completely empty. The dummy wires 230 do not electrically connect components. However, the dummy wires 230 provide similar reflection conditions between a first portion of the display area AA having the connection wires 200 (e.g., the first area S1 and the second area S2) and a second portion of the display area that does not have the connection wires 200. While the branches 211 are shown in the exemplary embodiments of FIGS. 3-4 as being perpendicular to the longitudinal extending direction of the connection wires 200, in other embodiments, the branches may diverge from the longitudinal direction at other angles. Furthermore, in other exemplary embodiments, the branches 211 may have different arrangements.

In an exemplary embodiment, the peripheral area PA may surround the display area AA. The peripheral area PA, which is an area having no pixel PX, may include the pad area PADA. The pad area PADA is an area that may include various electronic devices or a printed circuit board or other elements that are electrically attached, and a voltage line, etc. that supplies power for driving the light-emitting device.

A bending area BA may be located between the pad area PADA of the peripheral area PA and the display area AA. For example, the bending area BA may be located between the pad area PADA and the display area AA in the X direction. The substrate 100 may be configured to bend in the bending area BA to allow the pad area PADA to at least partially overlap the display area AA. For example, a bending direction may be set so that the bent pad area PADA may be located behind the display area AA. Accordingly, the user may recognize the display area AA as occupying the majority of the display apparatus 10. The substrate 100 may include various flexible or bendable materials for the bending area BA.

Structures of the data lines DL and the connection wires 200 will now be described in detail with reference to FIGS. 2 and 3.

Figure 2:
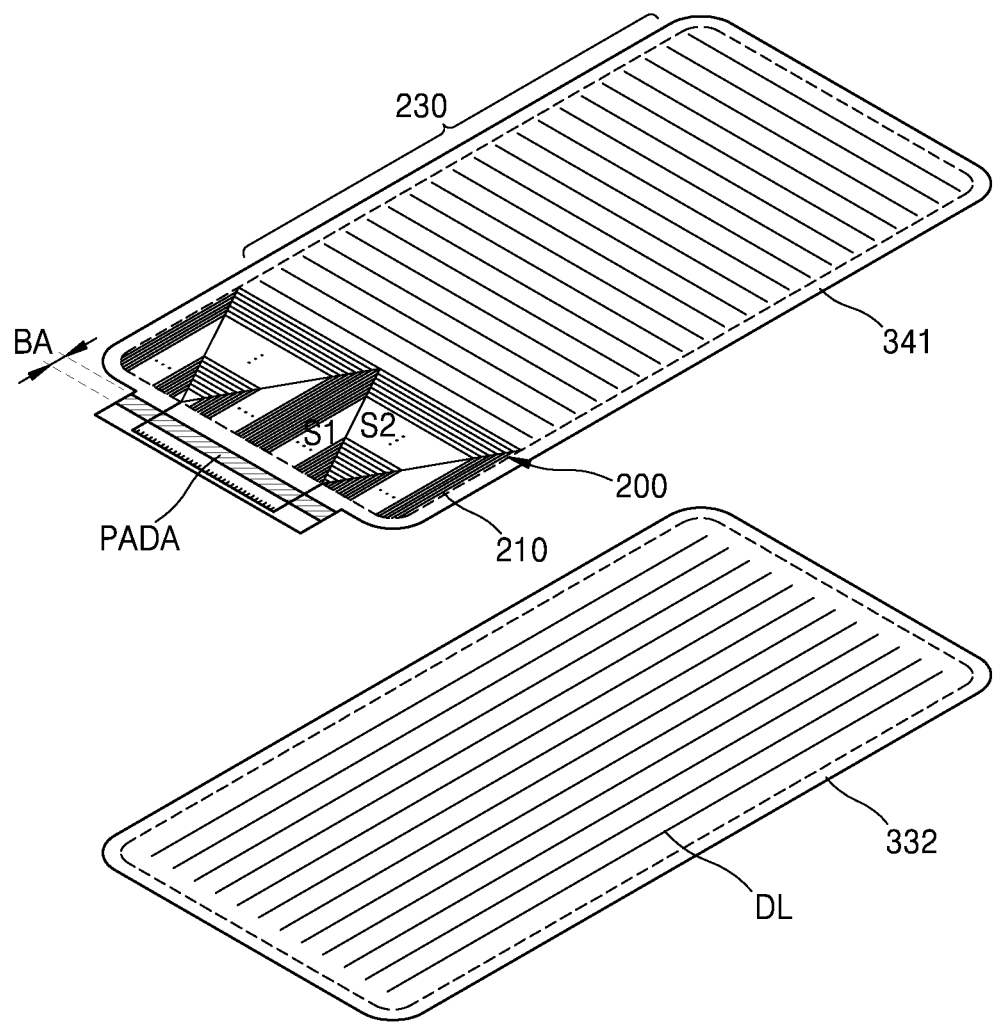
FIG. 2 is an exploded perspective view showing separate layers of the display apparatus according to an exemplary embodiment of the present inventive concepts.

As shown in the exemplary embodiment of FIG. 2, the data lines DL and the connection wires 200 are arranged on different layers from each other. For example, the connection wires 200 and the dummy wires 230 are arranged on a first organic insulating film 341. The data lines DL are arranged on a second interlayer insulating film 332. The first organic insulating film 341 and the second interlayer insulating film 332 may be stacked on each other. For example, the first organic insulating film 341 may be disposed on the second interlayer insulating film 332 in a third direction Z (hereinafter, the "Z direction). The Z direction may extend perpendicular to an upper surface of the substrate 100 (e.g., in a thickness direction of the substrate and may be perpendicular to the X direction and the Y direction. Each connection wire 200 and each data line DL may be electrically connected to each other through contact on one side via a contact hole in the first organic insulating film 341.

Figure 3:
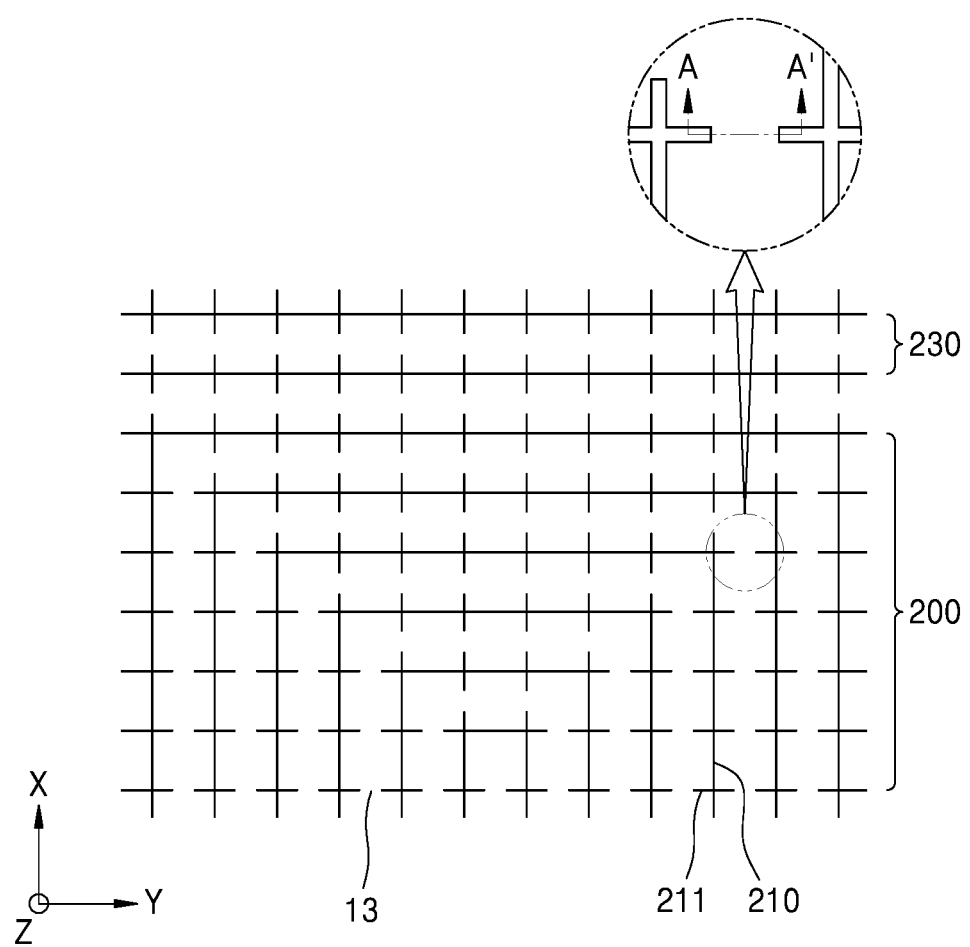
FIG. 3 is an enlarged plan view of connection wires shown in FIG. 1 according to an exemplary embodiment of the present inventive concepts.

As shown in FIG. 3, each of the connection wires 200 may include the plurality of branches 211 diverging from a body 210 of the connection wire 200 and extend in a direction perpendicular to a longitudinal direction. For example, as shown in the exemplary embodiment of FIG. 3, the connection wires 200 having bodies 210 extending longitudinally in the X direction may have branches 211 extending in the Y direction. The connection wires 200 having bodies 210 extending in the Y direction may have branches 211 extending in the X direction.

The branches 211 diverge symmetrically with respect to the body 210 of the connection wire 200. For example, the branches 211 diverge from the connection wire 200 in two directions perpendicular to the longitudinal extension direction of the body 210 thereof. The branches 211 diverging from two adjacent connection wires 200 toward each other are spaced apart by a gap 11 Since respective connection wires 200 transfer signals to different data lines DL from each other, the gap 13 permit the ends of adjacent branches 211 to be spaced apart from each other to avoid mixing of signals.

The branches 211 in the connection wires 200 prevent significant differences between the reflection characteristics of light in the first area S1 and the second area S2 of the connection wires 200. For example, since the bodies 210 of the connection wires 200 extend only in the X direction in the first area S1 and extend only in the Y direction in the second area S2, reflection characteristics of light differ would greatly between the first and second areas S1 and 82 if there are no branches 211. The substantial differences in the reflection characteristics would make it highly likely that the connection wires 200 would be visible to the user if the connection wires did not include branches 211. However, when the branches 211 diverge perpendicularly from the bodies 210 of the connection wires 200, the wire extension structures in the first area S1 and the second area S2 become similar and the reflection characteristics of light also become similar. As a result, the visibility of the connection wires 200 to the user is greatly reduced or eliminated. Accordingly, the inclusion of branches 211 on the connection wires 200 may prevent or reduce recognition of the division between the first area S1 and the second area S2 according to an incidence angle of light because reflection characteristics of light in the first area S1 and the second area S2 become similar.

The dummy wires 230 may be arranged in the third area. S3. The dummy wires 230 provide similar reflection characteristics of light as the connection wires 200 in the first area S1 and the second area S2. Therefore, a phenomenon in which the user is able to visualize the third area. S3 as being distinct from the first area S1 and the second area S2 may be reduced or eliminated. As described above, the dummy pattern 230 does not electrically connect components and is in a floating state. In an exemplary embodiment, the dummy pattern 230 also includes the branches 211 which are configured similarly to the branches described with respect to the connection wires 200.

The formation of the branches 211 may reduce or prevent the connection wires 200 from being clearly visible to the user. However, the branches 211 may cause the gap 13 to be visible to the user. For example, as shown in FIG. 3, gaps 13 between distal ends of the branches 211 extending from the bodies 210 of adjacent connection wires 200 toward each other are distributed in a certain pattern over numerous regions, Accordingly, the gaps 13 may serve as another visible pattern that may be clearly visible to the user (e.g., according to an incidence angle of light).

Figure 4A:
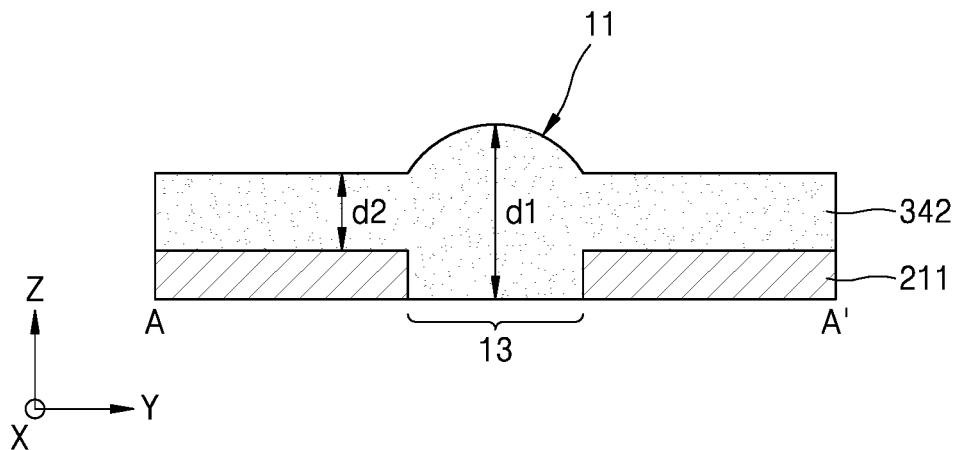
FIG. 4A is a cross-sectional view taken along line A-A' of FIG. 3 according to an exemplary embodiment of the present inventive concepts.

As shown in the exemplary embodiment of FIG. 4A, the second organic insulating film 342 includes a protrusion 11 that is formed in the gap 13 and protrudes in an opposite direction to the gap 13. For example, the protrusion 11 is formed in the second organic insulating film 342 and has a thickness d1 in a location corresponding to the gap 13. The protrusion 11 may extend in the Z direction past a top portion of the second organic insulating film 342 disposed on the bodies 210 of the connection wires and the branches 211. In an exemplary embodiment, the thickness d1 of the protrusion (e.g., the distance between a bottom portion of the protrusion positioned on a bottom portion of the gap 13 and a top portion of the protrusion in the Z direction) is about 1.5 times to about 2.5 times as great as a thickness d2 of the second organic insulating film 342, which is formed on the bodies 210 and the branches 211 of the connection wires 200. However, exemplary embodiments of the present inventive concepts are not limited thereto and in other exemplary embodiments, the thickness d1 of the protrusion may be greater than about 2.5 times the thickness d2 of the second organic insulating film 342, etc. The protrusion 11 may be formed by patterning using a halftone mask. In exemplary embodiments in which the protrusion 11 extends convexly in a dome shape in an opposite direction to the gap 13 (e.g., in the Z direction away from the gap) as shown in FIG. 4A, a pattern of the gap 13 is not clearly visible to the user as compared to embodiments in which there is no protrusion 11.

Figure 4B:
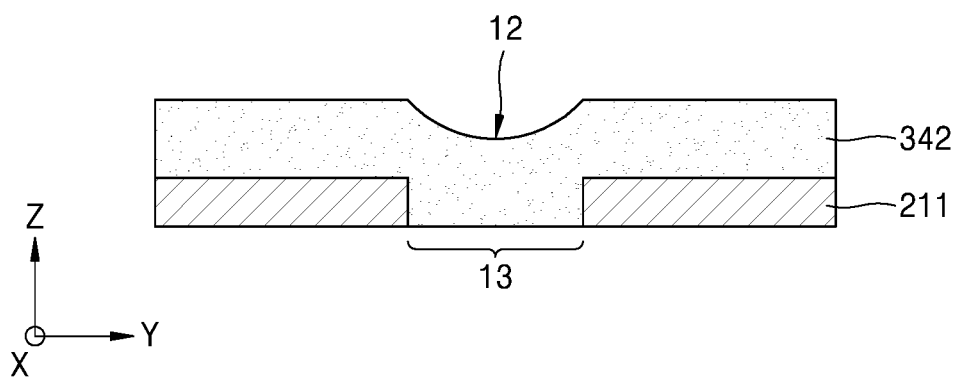
FIG. 4B is a cross-sectional view showing a structure having no protrusion as a comparison example to FIG. 4A.

FIG. 4B shows an embodiment in which the second organic insulating film 342 does not include a protrusion 11 for comparative purposes. Instead, the second organic insulating film 342 has a substantially identical thickness in the regions formed in the gap 13 and the regions formed on the bodies 210 of the connection wires 200, and a recessed groove 12 having a concave shape is formed in the second organic insulating film 342 due to steps of the gap 13. The recessed groove 12 may be a clearly visible pattern to the user.

However, as shown in FIG. 4A, when a protrusion 11 that extends convexly in a dome shape in a direction away from the bottom gap 13 is formed in a location of the gap, the protrusion 11 provides a diffused reflection of light that is not clearly visible to the user (e.g., the reflected light may be barely visible or not visible at all to the user). In this regard, a direction in which the user looks at the display area AA may be a direction from an upper side of FIG. 4A toward a lower side of FIG. 4A.

Figure 4C:
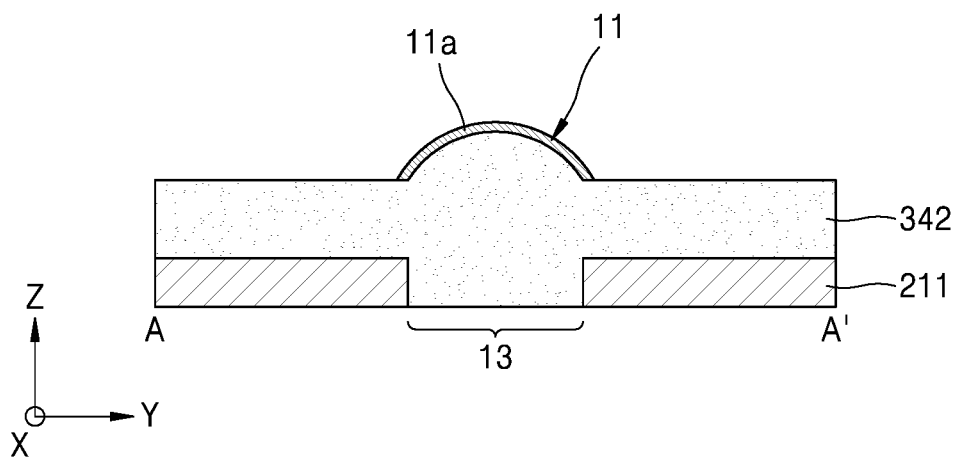
FIG. 4C is a cross-sectional view taken along line A-A' of FIG. 3 according to another exemplary embodiment of the present inventive concepts.

As shown in the exemplary embodiment of FIG. 4C, a metal layer 11a may be formed on the protrusion 11. For example, the metal layer 11a may be disposed on a top surface of the protrusion 11 (e.g., in the Z direction). The metal layer 11a. may include the same material as the bodies 210 and the branches 211 of the connection wires 200. This exemplary embodiment may provide a greater reduction of the visibility of a pattern to the user due to the gap 13. For example, even reflection pattern differences arising from the usage of different materials in a region of the gap 13 and a region of the connection wires 200 in the same plane may be reduced by forming the metal layer 11a on the protrusion 11. The arrangement of the branches 211 and the protrusion 11 for preventing the connection wires 200 from being visible to the user may be variously modified as will be described later.

Figure 5:
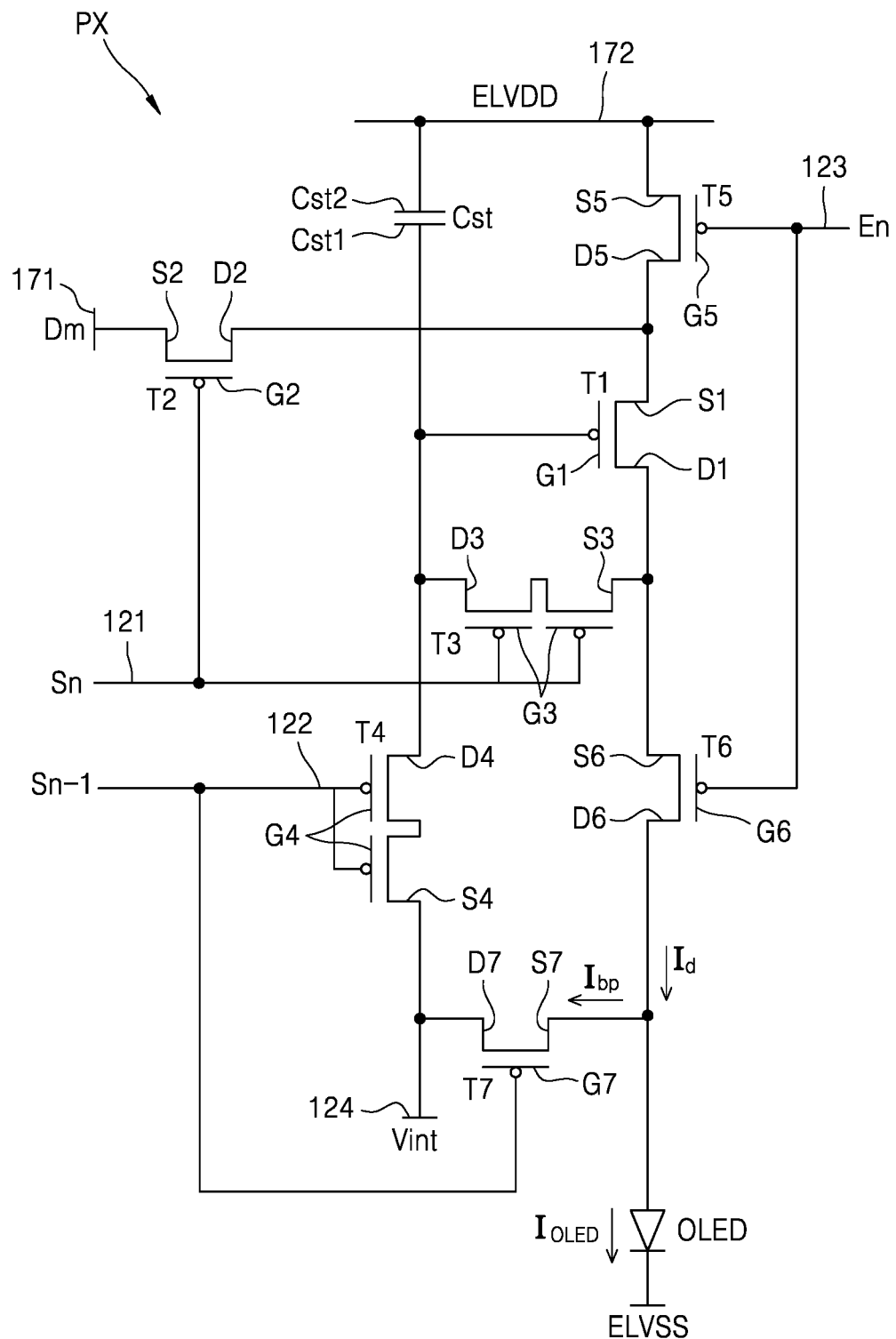
FIG. 5 is an equivalent circuit diagram of a pixel shown in FIG. 1 according to an exemplary embodiment of the present inventive concepts.

FIG. 5 is an equivalent circuit diagram of the pixel PX. As shown in FIG. 5, the pixel PX may include a plurality of thin film transistors T1, T2, T3, T4, T5, T6, and T7, a capacitor Cst, and an organic light-emitting device OLED. The plurality of thin film transistors T1, T2, T3, T4, T5, T6, and T7 and the capacitor Cst may be components included in a circuit portion of the pixel PX. The circuit portion is electrically connected to a plurality of signal lines 121, 122, 123, 124, and 171 and a power supply line 172.

The transistors may include a driving thin film transistor T1, a switching thin film transistor T2, a compensation thin film transistor T3, an initialization thin film transistor T4, an operation control thin film transistor T5, an emission control thin film transistor T6, and a bypass thin film transistor T7. While the exemplary embodiment shown in FIG. 5 shows seven transistors, exemplary embodiments of the present inventive concepts are not limited thereto.

The signal lines include a scan line 121 (SL of FIG. 1) that transfers a scan signal Sn, a. previous scan line 122 that transfers a previous scan signal Sn−1 to the initialization thin film transistor T4 and the bypass thin film transistor T7, an emission control line 123 that transfers an emission control signal En to the operation control thin film transistor T5 and the emission control thin film transistor T6, a data line 171 (DL of FIG. 1) that crosses the scan line 121 and transfers a data signal Dm, and an initialization voltage line 124 that transfers an initialization voltage Vint for initializing the driving thin film transistor T1.

As the data signal Dm is transmitted to the driving thin film transistor T1 according to a switching operation of the switching thin film transistor T2, the driving thin film transistor T1 supplies a driving current $I_{OLED}$ to the organic light-emitting device OLED. A gate electrode G1 of the driving thin film transistor T1 is connected to a capacitor lower electrode Cst1 of the capacitor Cst, a source electrode S1 of the driving thin film transistor T1 is connected to the power supply line 172 via the operation control thin film transistor T5, and a drain electrode D1 of the driving thin film transistor T1 is electrically connected to a pixel electrode of the organic light-emitting device OLED via the emission control thin film transistor T6.

A gate electrode G2 of the switching thin film transistor T2 is connected to the scan line 121. A source electrode S2 of the switching thin film transistor T2 is connected to the data line 171. A drain electrode D2 of the switching thin film transistor T2 is connected to the source electrode S1 of the driving thin film transistor T1 and is also connected to the power supply line 172 via the operation control thin film transistor T5. When the switching thin film transistor T2 is turned on according to the scan signal Sn received through the scan line 121, the switching thin film transistor T2 performs a switching operation for transmitting the data signal Dm transmitted through the data line 171 to the source electrode S1 of the driving thin film transistor T1.

A gate electrode G3 of the compensation thin film transistor T3 is connected to the scan line 121. A source electrode S3 of the compensation thin film transistor T3 is connected to the drain electrode D1 of the driving thin film transistor Ti and is also connected to the pixel electrode of the organic light-emitting device OLED via the emission control thin film transistor T6. A drain electrode D3 of the compensation thin film transistor T3 is connected to the capacitor lower electrode Cst1 of the capacitor Cst, a drain electrode D4 of the initialization thin film transistor T4, and the gate electrode G1 of the driving thin film transistor T1. As the compensation thin film transistor T3 is turned on according to the scan signal Sn received through the scan line 121, the compensation thin film transistor T3 diode-connects the driving thin film transistor T1 by electrically connecting the gate electrode G1 and the drain electrode D1 of the driving thin film transistor T1 to each other.

A gate electrode G4 of the initialization thin film transistor T4 is connected to the previous scan line 122. A source electrode S4 of the initialization thin film transistor T4 is connected to a drain electrode D7 of the bypass thin film transistor T7 and the initialization voltage line 124. The drain electrode D4 of the initialization thin film transistor T4 is connected to the capacitor lower electrode Cst1 of the capacitor Cst, the drain electrode D3 of the compensation thin film transistor T3, and the gate electrode G1 of the driving thin film transistor T1. As the initialization thin film transistor T4 is turned on according to the previous scan signal Sn−1 received through the previous scan line 122, the initialization thin film transistor T4 performs an initialization operation for initializing a voltage of the gate electrode G1 of the driving thin film transistor T1 by transmitting the initialization voltage Vint to the gate electrode G1 of the driving thin film transistor T1.

A gate electrode G5 of the operation control thin film transistor T5 is connected to the emission control line 123. A source electrode S5 of the operation control thin film transistor T5 is connected to the power supply line 172. A drain electrode D5 of the operation control thin film transistor T5 is connected to the source electrode S1 of the driving thin film transistor T1 and the drain electrode D2 of the switching thin film transistor T2.

A gate electrode G6 of the emission control thin film transistor T6 is connected to the emission control line 123. A source electrode S6 of the emission control thin film transistor T6 is connected to the drain electrode Di of the driving thin film transistor T1 and the source electrode S3 of the compensation thin film transistor T3. A drain electrode D6 of the emission control thin film transistor T6 is electrically connected to a source electrode S7 of the bypass thin film transistor T7 and the pixel electrode of the organic light-emitting device OLED. Since the operation control thin film transistor T5 and the emission control thin film transistor T6 are simultaneously turned on according to the emission control signal En received through the emission control line 123, a driving voltage ELVIN) is transmitted to the organic light-emitting device OLED. Therefore, the driving current $I_{OLED}$ flows through the organic light-emitting device OLED.

A gate electrode G7 of the bypass thin film transistor T7 is connected to the previous scan line 122. The source electrode S7 of the bypass thin film transistor T7 is connected to the drain electrode D6 of the emission control thin film transistor T6 and the pixel electrode of the organic light-emitting device OLED. The drain electrode D7 of the bypass thin film transistor T7 is connected to the source electrode S4 of the initialization thin film transistor T4 and the initialization voltage line 124. The bypass thin film transistor T7 has the previous scan signal Sn−1 received by the gate electrode G7, the previous scan signal Sn−1 received through the previous scan line 122. When an electrical signal with a certain level of voltage capable of turning off the bypass thin film transistor T7 is received from the previous scan signal Sn−1, the bypass thin film transistor T7 is turned off. Therefore, some of a driving current $I_d$ escapes through the bypass thin film transistor T7 as a bypass current $I_{bp}$.

When the organic light-emitting device OLED emits light even in instances in which a minimum current of the driving thin film transistor T1 displaying a black image flows as a driving current, the black image fails to be displayed properly. In this regard, the minimum current of the driving thin film transistor T1 refers to a current under a condition where the driving thin film transistor T1 is turned off because a gate-source voltage of the driving thin film transistor T1 is less than a threshold voltage. Accordingly, to prevent the organic light-emitting device OLED from emitting light even when such a minimum current flows as a driving current, the bypass thin film transistor T7 may disperse some of the driving current $I_d$ flowing from the driving thin film transistor T1 into another current path aside from the current path toward the organic light-emitting device OLED as the bypass current $I_{bp}$. By transmitting a current less than a minimum driving current (e.g., a current of 10 pA or less) under a condition where the driving thin film transistor T1 is turned off to the organic light-emitting device OLED, the organic light-emitting device OLED is prevented from emitting light or an emission degree thereof is reduced. Therefore, a black image is implemented.

Although the exemplary embodiment shown in FIG. 5 shows the initialization thin film transistor T4 and the bypass thin film transistor T7 connected to the previous scan line 122, exemplary embodiments of the present inventive concepts are not limited thereto. According to another exemplary embodiment, the initialization thin film transistor T4 may be connected to the previous scan line 122 and be driven according to the previous scan signal Sn−1, and the bypass thin film transistor T7 may be connected to a separate wire and be driven according to a signal transmitted to the separate wire.

A capacitor upper electrode Cst2 of the capacitor Cst is connected to the power supply line 172, and an opposite electrode 430 (refer to FIG. 12) of the organic light-emitting device OLED is connected to a common voltage ELVSS. Accordingly, the organic light-emitting device MED may receive the driving current $I_{OLED}$ from the driving thin film transistor T1 and emit light.

Although the exemplary embodiment of FIG. 5 shows the compensation thin film transistor T3 and the initialization thin film transistor T4 each having a dual gate electrode, exemplary embodiments of the present inventive concepts are not limited thereto. For example, the compensation thin film transistor T3 and the initialization thin film transistor T4 may each have only one gate electrode. In other exemplary embodiments, at least one of the other thin film transistors T1, T2, 15, 16, and T7 except for the compensation thin film transistor T3 and the initialization thin film transistor T4 may have a dual gate electrode.

Figure 6:
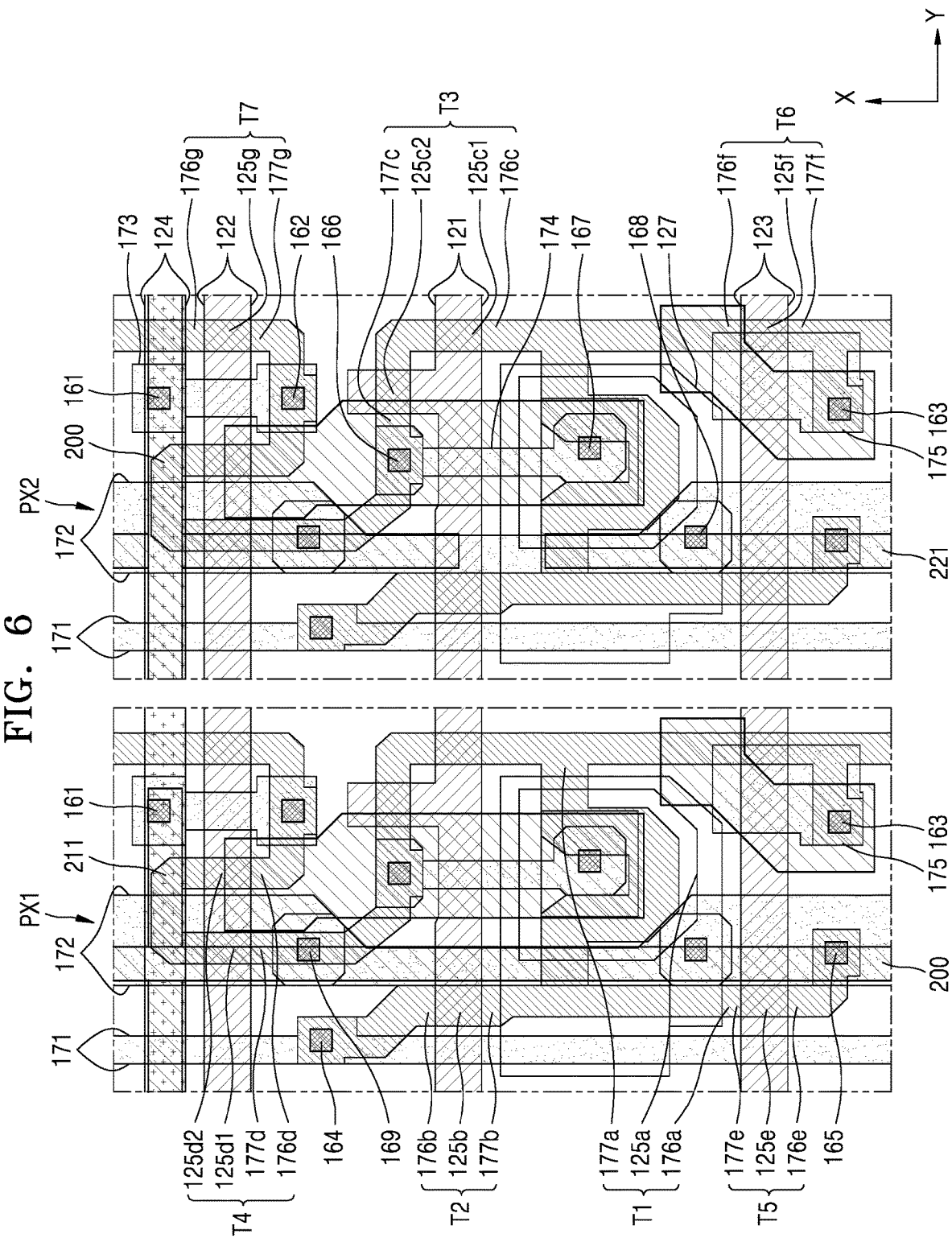
FIG. 6 is a top plan view including thin film transistors and a capacitor arranged in the pixel shown in FIG. 1 according to an exemplary embodiment of the present inventive concepts.
Figure 12:
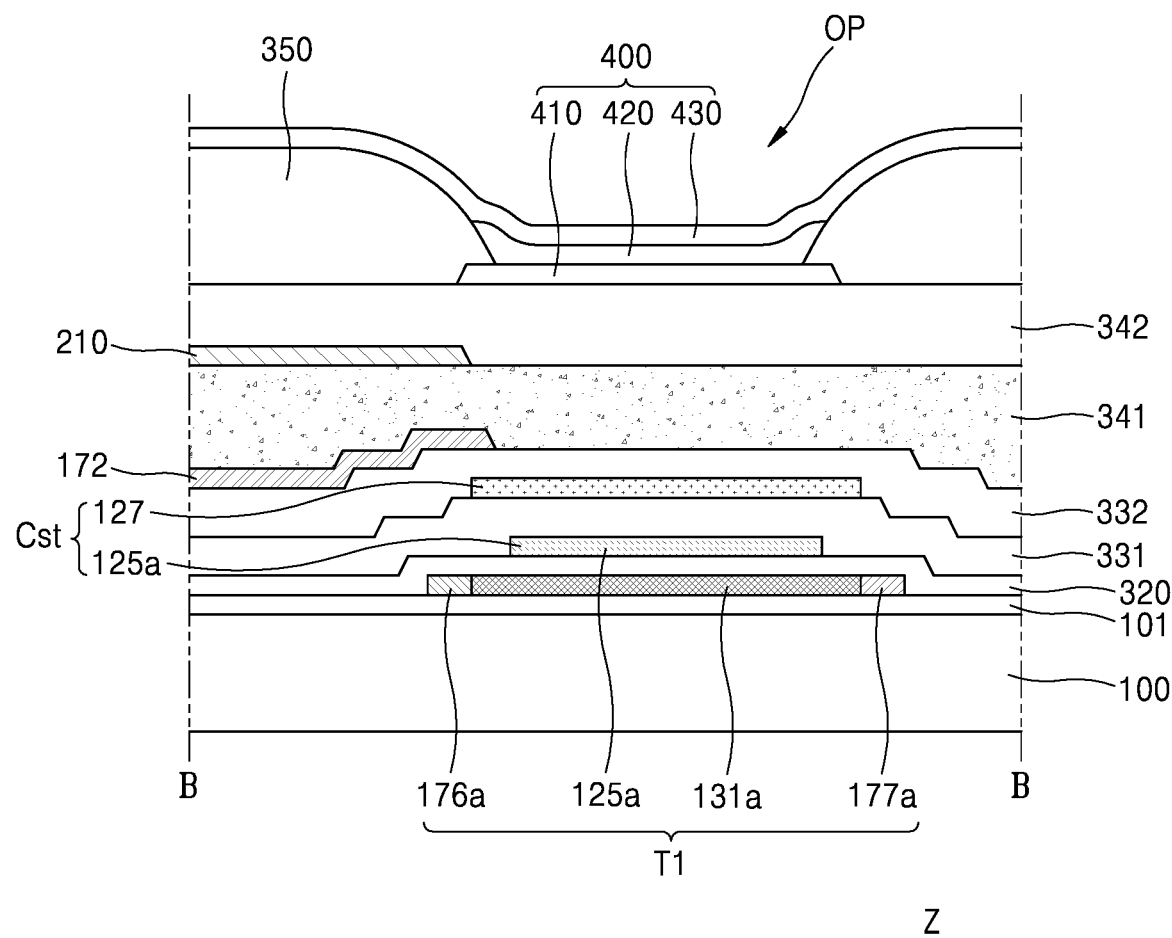
FIG. 12 is a cross-sectional view taken along line B-B' of FIG. 11 according to an exemplary embodiment of the present inventive concepts.

FIG. 6 is a top plan view showing locations of thin film transistors, a capacitor, etc. of each of a first pixel PX1 located in the first area S1 (of FIG. 1) and a second pixel PX2 located in the second area S2 (of FIG. 1), FIGS. 7 to 11 are top plan views showing components such as the thin film transistors, the capacitor, etc. in each of the first pixel PX1 and the second pixel PX2 according to layers. FIG. 12 is a cross-sectional view taken along line B-B of FIG. 11.

As shown in FIG. 12, a display apparatus includes the substrate 100.

In an exemplary embodiment, the substrate 100 may include various flexible or bendable materials. For example, the substrate 100 may include polymer resin such as polyethersulfone (PES), polyacrylate, polyetherimide (PH), polyethylene naphthalate (PEN), polyethylene terephthalate (PET), polyphenylene sulfide (PPS), polyarylate (PAR), polyimide (PT). polycarbonate (PC), or cellulose acetate propionate (CAP). However, exemplary embodiments of the present inventive concepts are not limited thereto. Various modifications may be made, for example, the substrate 100 may have a multilayer structure including two layers each including the polymer resin described above and a barrier layer between the two layers. The barrier layer may include an inorganic material such as silicon oxide (SiOx), silicon nitride (SiNx), silicon oxynitride (SiON), etc.

A plurality of pixels including the first pixel PX1 and the second pixel PX2 may be located over the substrate 100. In an exemplary embodiment, a buffer layer 101 may be included on the substrate 100. For example, as shown in the exemplary embodiment of FIG. 12, the buffer layer 101 may be disposed directly on the substrate in the Z direction. The buffer layer 101 may planarize a surface of the substrate 100 or may prevent the penetration of impurities, etc. into a semiconductor layer on the buffer layer 101. The buffer layer 101 may have a single-layer/multilayer structure including an inorganic insulating material such as silicon oxide, silicon nitride, or silicon oxynitride.

Figure 7:
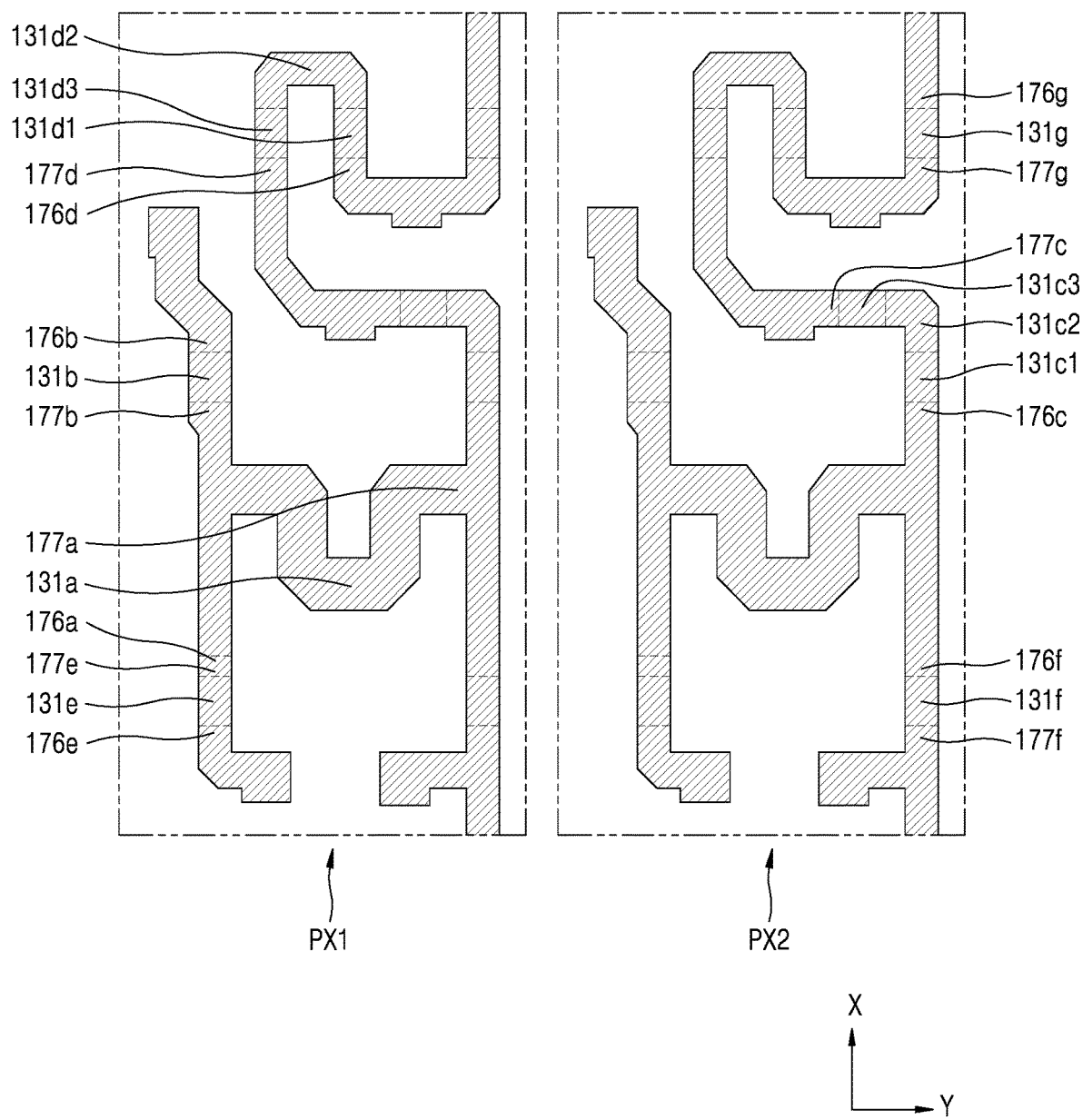
FIGS. 7 to 11 are top plan views showing components of FIG. 6 arranged in separate layers according to exemplary embodiments of the present inventive concepts.

A semiconductor layer may be disposed on the buffer layer 101. FIG. 7 shows an exemplary embodiment of the semiconductor layer disposed on the buffer layer 101. As shown in FIG. 7, the semiconductor layer may be curved in various shapes, and the first pixel PX1 and the second pixel PX2 may respectively include semiconductor layers having the same shape. Hereinafter, when respective layers of the first pixel PX1 and the second pixel PX2 have the same shape, a description thereof will be given without distinction.

The semiconductor layer may include a driving channel region 131a corresponding to the driving thin film transistor T1, a switching channel region 131b corresponding to the switching thin film transistor T2, compensation channel regions 131c1, 131c2, and 131c3 corresponding to the compensation thin film transistor T3, initialization channel regions 131d1, 131d2, and 131d3 corresponding to the initialization thin film transistor T4, an operation control channel region 131e corresponding to the operation control thin film transistor T5, an emission control channel region 131f corresponding to the emission control thin film transistor T6, and a bypass channel region 131g corresponding to the bypass thin film transistor T7. The driving channel region 131a, the switching channel region 131b, the compensation channel regions 131c1, 131c2, and 131c3, the initialization channel regions 131d1, 131d2, and 131d3, the operation control channel region 131e, the emission control channel region 131f, and the bypass channel region 131g may be some of the regions of the semiconductor layer shown in FIG. 7. However, in exemplary embodiments, the semiconductor layer may include a plurality of other regions.

In an exemplary embodiment, the semiconductor layer may include polysilicon. In addition, the semiconductor layer may include source regions and drain regions formed by doping both sides of the channel regions with impurities. In exemplary embodiments of the present inventive concepts, the impurities may vary according to the types of the thin film transistors and may include N-type impurities or P-type impurities. An active layer comprises a channel region, a source region located on one side of the channel region, and a drain region located on the other side of the channel region. The thin film transistor may have an active layer, and the active layer may include a channel region, a source region, and a drain region.

The source region and the drain region formed by doping may comprise a source electrode and a drain electrode of the thin film transistor in some exemplary embodiments. For example, a driving source electrode may correspond to a driving source region 176a doped with impurities near the driving channel region 131a in the semiconductor layer shown in FIG. 7. A driving drain electrode may correspond to a driving drain region 177a doped with impurities near the driving channel region 131a in the semiconductor layer shown in FIG. 7.

A gate insulating film 320 may be disposed on the semiconductor layer. The gate insulating film 320 may include an inorganic insulating material such as silicon nitride, silicon oxide, or silicon oxynitride. However, exemplary embodiments of the present inventive concepts are not limited thereto.

Figure 8:
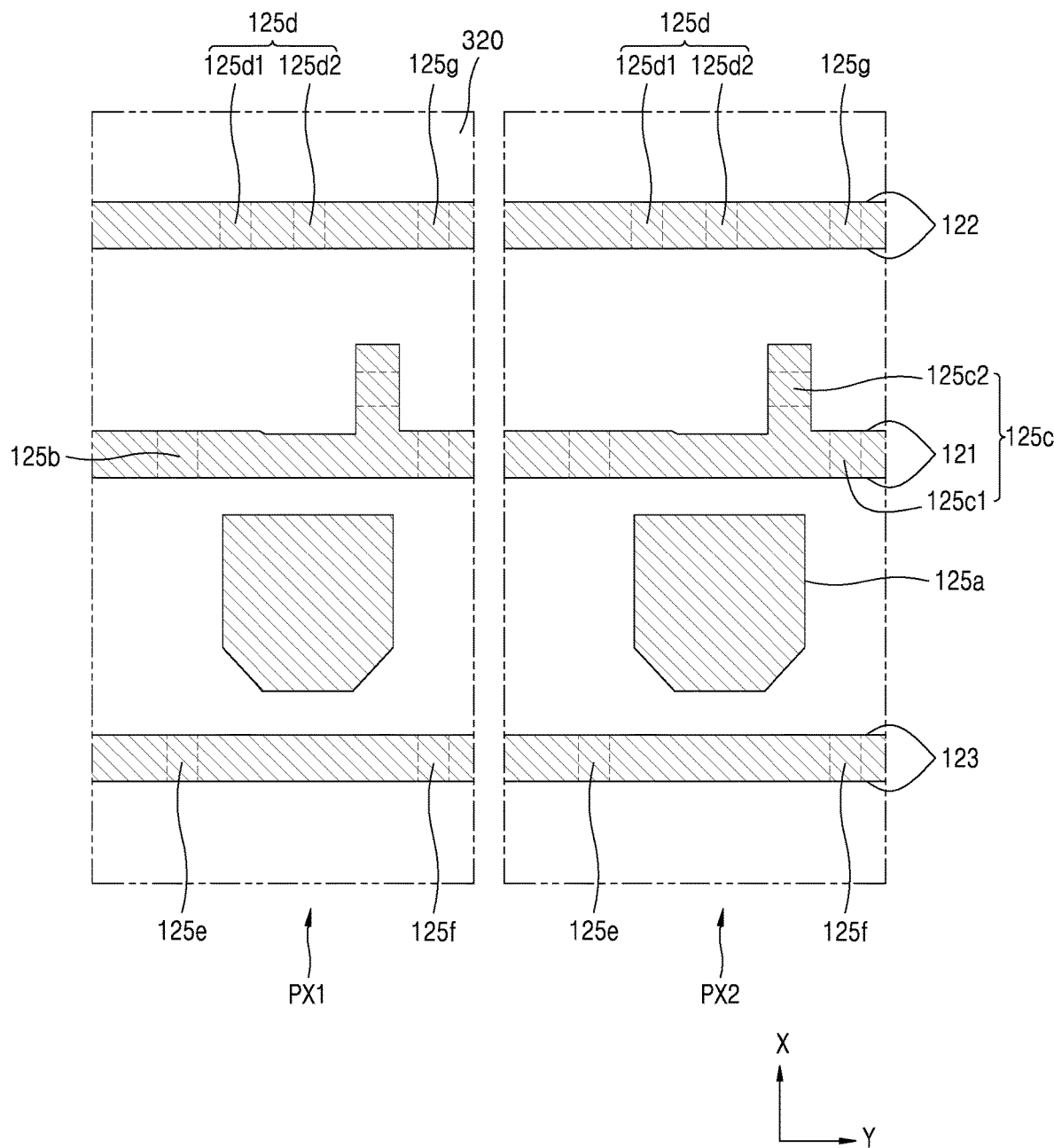

Conductive layers such as the gate electrode G1 are located on the gate insulating film 320, wherein G1 to G6 of FIG. 5 may correspond to 125a to 125f of FIG. 8, respectively. In addition, various conductive layers may be located on the gate insulating film 320, and these various conductive layers located on the gate insulating film 320 may be commonly called a gate wire. As shown in FIG. 8, the gate wire may include the scan line 121, the previous scan line 122, the emission control line 123, and the gate electrode 125a.

The capacitor Cst may overlap the driving thin film transistor T1, and the capacitor lower electrode Cst1 may be the gate electrode 125a of the driving thin film transistor T1. Thus, areas of the capacitor Cst and the driving thin film transistor T1 may increase, and a high-quality image may be provided. However, exemplary embodiments of the present inventive concepts are not limited thereto. For example, in another exemplary embodiment, the capacitor Cst may not overlap the driving thin film transistor T1, and the capacitor lower electrode Cst1 may be an independent component that is separate from the gate electrode 125a of the driving thin film transistor T1.

As shown in FIG. 8, a switching gate electrode 125b and compensation gate electrodes 125c1 and 125c2 may be portions of the scan line 121 crossing the semiconductor layer or portions protruding from the scan line 121. Initialization gate electrodes 125d1 and 125d2 and. a bypass gate electrode 125g may be portions of the previous scan line 122 crossing the semiconductor layer or portions protruding from the previous scan line 122. An operation control gate electrode 125e and an emission control gate electrode 125f may be portions of the emission control line 123 crossing the semiconductor layer or portions protruding from the emission control line 123.

A first interlayer insulating film 331 may cover the gate wire. In an exemplary embodiment, the first interlayer insulating film 331 may include an inorganic insulating material such as silicon nitride, silicon oxide, silicon oxynitride, etc.

Figure 9:
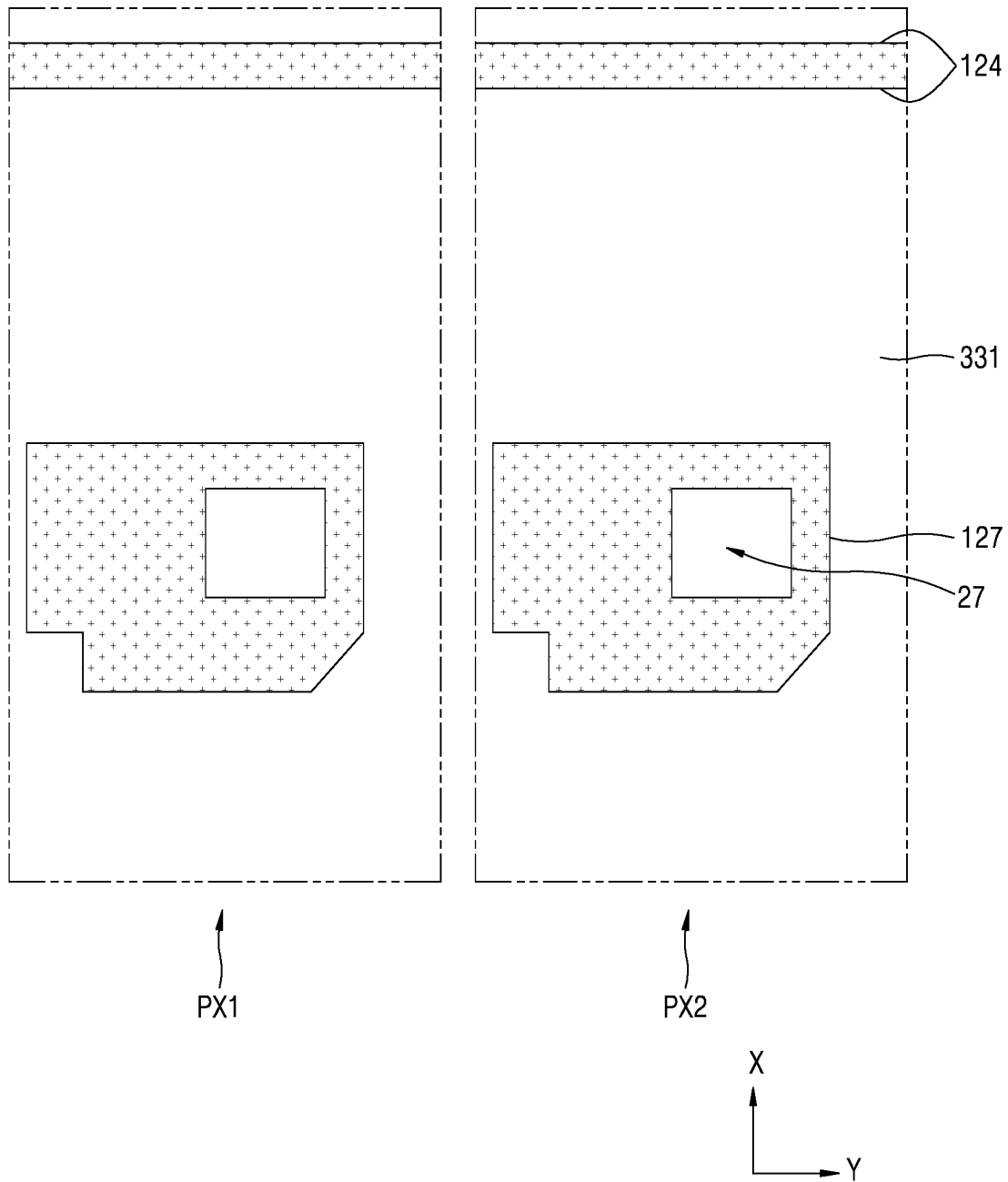

The capacitor upper electrode Cst2 may be located on the first interlayer insulating film 331 and the capacitor upper electrode Cst2 of FIG. 5 may correspond to element 127 of FIG. 9. In addition, as shown in FIG. 9, on the first interlayer insulating film 331, the initialization voltage line 124 may be located on the same layer as the capacitor upper electrode 127.

As shown in FIG. 9, the capacitor upper electrode 127 may include an opening 27. The capacitor lower electrode 125a and a compensation drain region 177c of the compensation thin film transistor T3 may be electrically connected to each other using a connection member 174 described below.

The second interlayer insulating film 332 is disposed on the capacitor upper electrode 127. In an exemplary embodiment, the second interlayer insulating film 332 includes an inorganic insulating material such as silicon nitride, silicon oxide, silicon oxynitride, etc.

Figure 10:
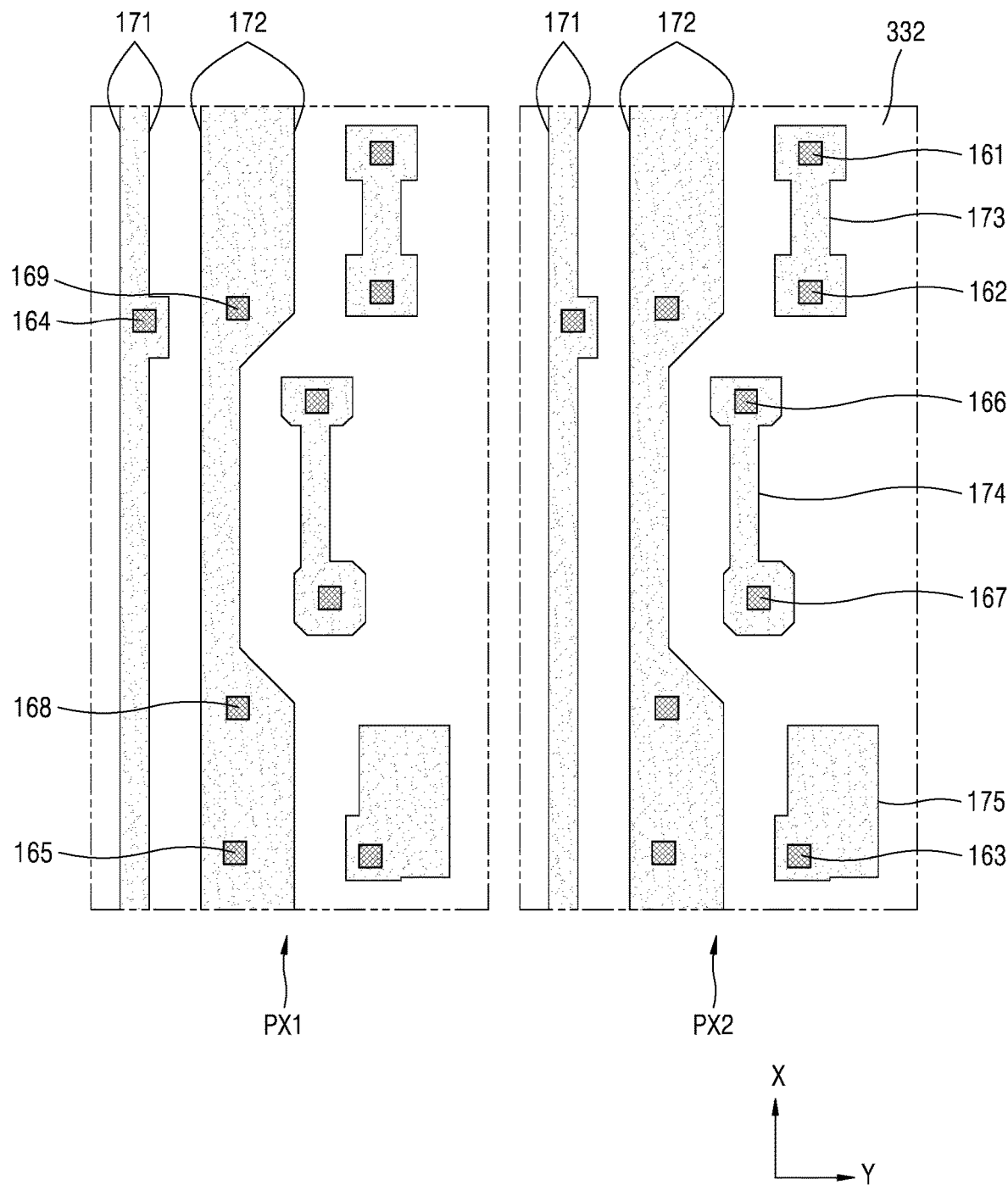
Figure 11:
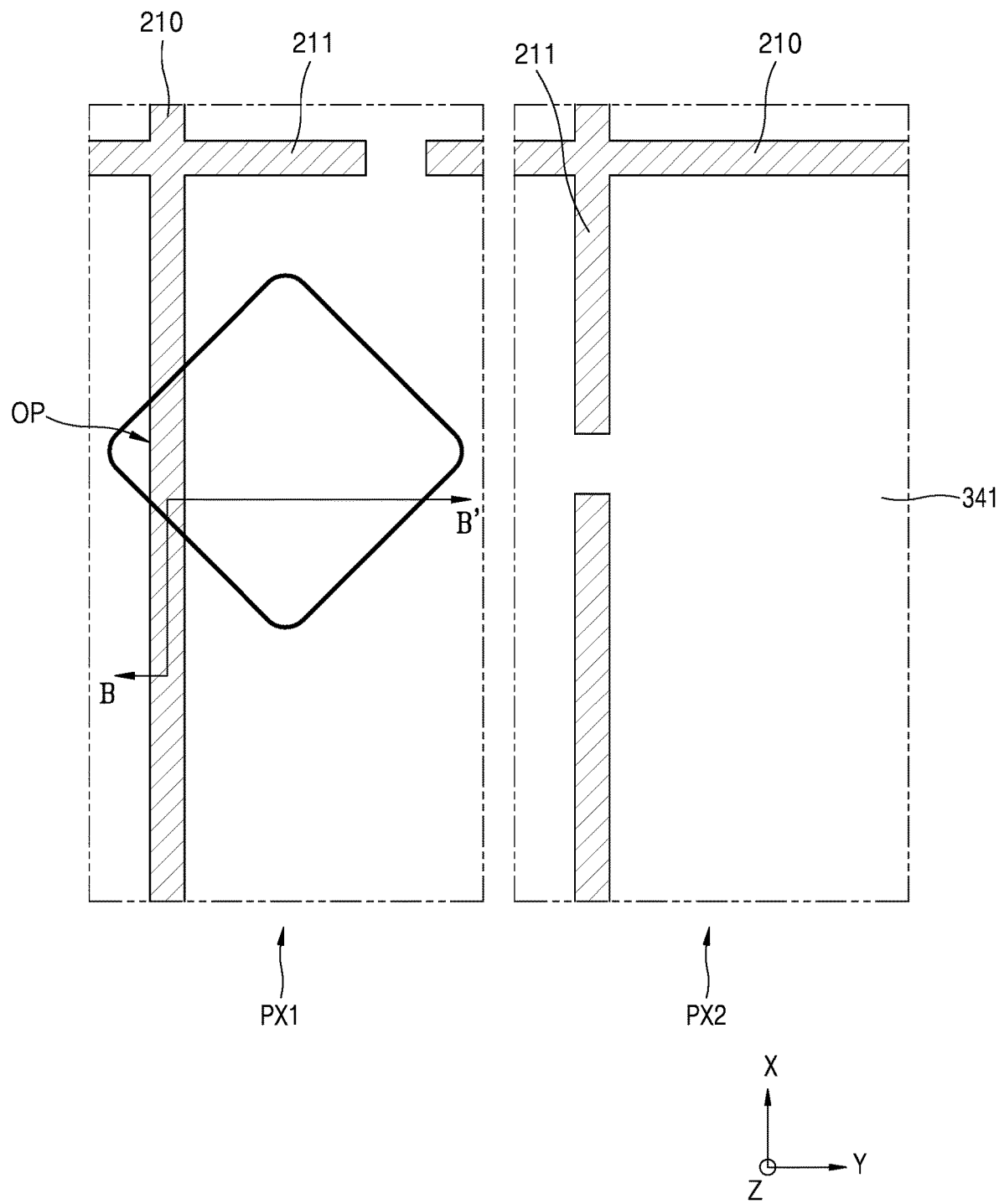

As shown in the exemplary embodiment of FIG. 10, the power supply line 172 may be disposed on the second interlayer insulating film 332. The power supply line 172 may be connected to the capacitor upper electrode 127 via a contact hole 168 in the second interlayer insulating film 332 and may be connected to the semiconductor layer below the power supply line 172 via contact holes 165 and 169 in the gate insulating film 320, the first interlayer insulating film 331, and the second interlayer insulating film 332.

In addition to the power supply line 172, various conductive layers may be arranged on the second interlayer insulating film 332. For example, as shown in FIG. 10, the data line 171, an initialization connection line 173, the connection member 174, a drain electrode 175, etc. may be arranged on the second interlayer insulating film 332.

The data line 171 may be connected to a switching source region 176b via a contact hole 164 in the gate insulating film 320, the first interlayer insulating film 331, and the second interlayer insulating film 332.

One end of the initialization connection line 173 may be connected to the initialization voltage line 124 via a contact hole 161 in the first interlayer insulating film 331 and the second interlayer insulating film 332, and the other end of the initialization connection line 173 may be connected to an initialization source region 176d via a contact hole 162 in the gate insulating film 320, the first interlayer insulating film 331, and the second interlayer insulating film 332. An initialization drain region 177d is a portion of the semiconductor layer doped with impurities on the opposite side of the initialization source region 176d with an initialization channel region therebetween.

One end of the connection member 174 is connected to the compensation drain region 177c and the initialization drain region 177d via a contact hole 166 in the gate insulating film 320, the first interlayer insulating film 331, and the second interlayer insulating film 332. The other end of the connection member 174 is connected to the capacitor lower electrode 125a via a contact hole 167 in the first interlayer insulating film 331 and the second interlayer insulating film 332. In this regard, the other end of the connection member 174 is connected to the capacitor lower electrode 125a via the opening 27 in the capacitor upper electrode 127. 1001021 The drain electrode 175 may be connected to an emission control drain region 177f via a contact hole 163 in the gate insulating film 320, the first interlayer insulating film 331, and the second interlayer insulating film 332. The drain electrode 175 may be electrically connected to a pixel electrode 410. In addition to the drain electrode 175, a source electrode may also be located on the second interlayer insulating film 332.

The first organic insulating film 341 may be located on the power supply line 172 and the drain electrode 175. As shown in the exemplary embodiment of FIG. 11, the body 210 and the branches 211 of the connection wire 200 may be arranged on the first organic insulating film 341. The dummy pattern 230 may also be arranged on the first organic insulating film 341. Also, the second organic insulating film 342 may be located on the connection wire 200 and the dummy pattern 230.

The first organic insulating film 341 and the second organic insulating film 342 may each include an imide-based polymer, a general-purpose polymer such as poly(methyl methacrylate) (PMMA) or polystyrene (PS), a polymer derivative having a phenolic group, an acrylic polymer, an aryl ether-based polymer, an amide-based polymer, a fluorine-based polymer, a p-xylene-based polymer, a vinyl alcohol-based polymer, and a blend thereof.

In an exemplary embodiment, the body 210 and the branches 211 of the connection wire 200 and the dummy pattern 230 may be single-layer or multilayer films including at least one of aluminum (Al). copper (Cu), titanium (Ti), and an alloy thereof.

In the first pixel PX1, the body 210 of the connection wire 200 extends in a direction parallel to the first direction X. For example, the body 210 of the connection wire 200 may overlap the power supply line 172 (e.g., in the Z direction). The branches 211 may overlap the initialization voltage line 124 (e.g., in the Z direction).

In the second pixel PX2, the body 210 of the connection wire 200 extends in the Y direction. The branches 211 protrude from the body 210 in the X direction. For example, in the second pixel PX2, the body 210 of the connection wire 200 may overlap the initialization voltage line 124, and the branches 211 may overlap the power supply line 172.

Accordingly, the user's ability to recognize a division between the first area S1 and the second area S2 due to an incidence angle of light may be prevented or reduced because a pattern formed by the connection wire 200 and the branches 211 in the first pixel PX1 and a pattern formed by the connection wire 200 and the branches 211 in the second pixel PX2 are similar to each other.

In addition, the protrusion 11 is aligned with the gap 13 between the branches 211 to arrange the second organic insulating film 342.

A light-emitting device 400 having the pixel electrode 410, the opposite electrode 430, and an intermediate layer 420 including an emission layer may be located on the second organic insulating film 342. For example, in an exemplary embodiment, the light-emitting device 400 may be the organic light-emitting device OLED.

The pixel electrode 410 may be a (semi)transparent electrode or a reflective electrode. In exemplary embodiments in which the pixel electrode 410 is a (semi)transparent electrode, the pixel electrode 410 may include ITO, IZO, ZnO, $In_2O_3$, IGO, AZO, etc. In embodiments in which the pixel electrode 410 is a reflective electrode, the pixel electrode 410 may have a reflective film including Ag, Mg, Al, Pt, Pd, Au, Ni, Nd, Ir, Cr, and a compound thereof, and a layer including ITO, IZO, ZnO, $In_2O_3$, IGO, or AZO. However, exemplary embodiments of the present inventive concepts are not limited thereto. The pixel electrode 410 may include various materials, and a structure thereof may also have various modifications. For example, the pixel electrode 410 may have a single-layer or multilayer structure.

A pixel-defining film 350 covering a lateral edge of the pixel electrode 410 (e.g., in the X direction) may be arranged on the second organic insulating film 342. The pixel-defining film 350 has an opening OP corresponding to each pixel. The opening OP exposes at least a central portion of the pixel electrode 410, and thus defines a pixel. The pixel-defining film 350 may also increase a distance between the edge of the pixel electrode 410 and the opposite electrode 430 and thus may prevent the occurrence of an arc, etc. therebetween. In an exemplary embodiment, the pixel-defining film 350 may include an organic material, such as polyimide or hexamethyldisiloxane (HMDSO). However, exemplary embodiments of the present inventive concepts are not limited thereto.

The intermediate layer 420 may be arranged on the pixel electrode 410 exposed by the opening OP in the pixel-defining film 350. The intermediate layer 420 may include a low-molecular weight or polymer material. In exemplary embodiments in which the intermediate layer 420 includes a low-molecular weight material, the intermediate layer 420 may have a hole injection layer (HIL), a hole transparent layer (HTL), an emission layer (EML), an electron transport layer (ETL), an electron injection layer (EIL), etc. stacked in a single or complex structure, and may include various organic materials, including copper phthalocyanine (CuPc), N,N'-Di(naphthalene-1-yl)-N,N'-diphenyl-benzidine (NPB), tris-8-hydroxyquinoline aluminum ($Alq_3$), etc. The layers may be formed by vacuum deposition. However, exemplary embodiments of the present inventive concepts are not limited thereto.

In embodiments in which the intermediate layer 420 includes a polymer material, the intermediate layer 420 may generally have a structure including an HTL and an EML. In this regard, the HTL may include PIS DOT, and the EML may include a polymer material such as a poly-phenylenevinylene (PPV)-based polymer material, a polyfluorene-based polymer material, etc. A structure of the intermediate layer 420 is not limited thereto, and the intermediate layer 420 may have various structures. For example, the intermediate layer 420 may include an integral layer over a plurality of pixel electrodes 410 or may include a layer patterned to correspond to each of a plurality of pixel electrodes 410.

The opposite electrode 430 may cover the display area AA. For example, the opposite electrode 430 may be integrally formed to cover a plurality of light-emitting devices 400. The opposite electrode 430 may be a (semi)transparent electrode or a reflective electrode. In embodiments in which the opposite electrode 430 is a (semi)transparent electrode, the opposite electrode 430 may have a layer including metal having a low work function, such as Li, Ca, LiF/Ca, LiF/Al, Al, Ag, Mg, and a compound thereof, and a (semi)transparent conductive layer including IZO, ZnO, or $In_2O_3$. In exemplary embodiments in which the opposite electrode 430 is a reflective electrode, the opposite electrode 430 may have a layer including Li, Ca, LiF/Ca, LiF/Al, Al, Ag, Mg, and a compound thereof. However, a structure and material of the opposite electrode 430 is not limited thereto and exemplary embodiments of the present inventive concepts may have various modifications.

As described above, the arrangement of the branches 211 and the protrusion 11 for preventing the connection wires 200 from being visible to the user may be variously modified. In an exemplary embodiment shown in FIG. 13A, the branches 211 and the protrusions 11 may be arranged in a regular pattern. A regular pattern may refer to arrangements of branches 211 and protrusions 11 in which the spacing is symmetrical in adjacent connection wires. For example, the branches 211 diverging from the body 210 of the connection wire 200 may all be formed in a regular pattern, and accordingly, the gap 13 may also have a similar arrangement. The protrusions 11 (11a) each disposed in a location corresponding to a gap 13 may also be formed in a regular pattern. In this regard, the protrusion 11 (11a) may be a protrusion having no metal layer 11a as shown in FIG. 4A or may be a protrusion having the metal layer 11a as shown in FIG. 4C, and thus, both of the reference numerals are given to denote a protrusion.

Figure 13A:
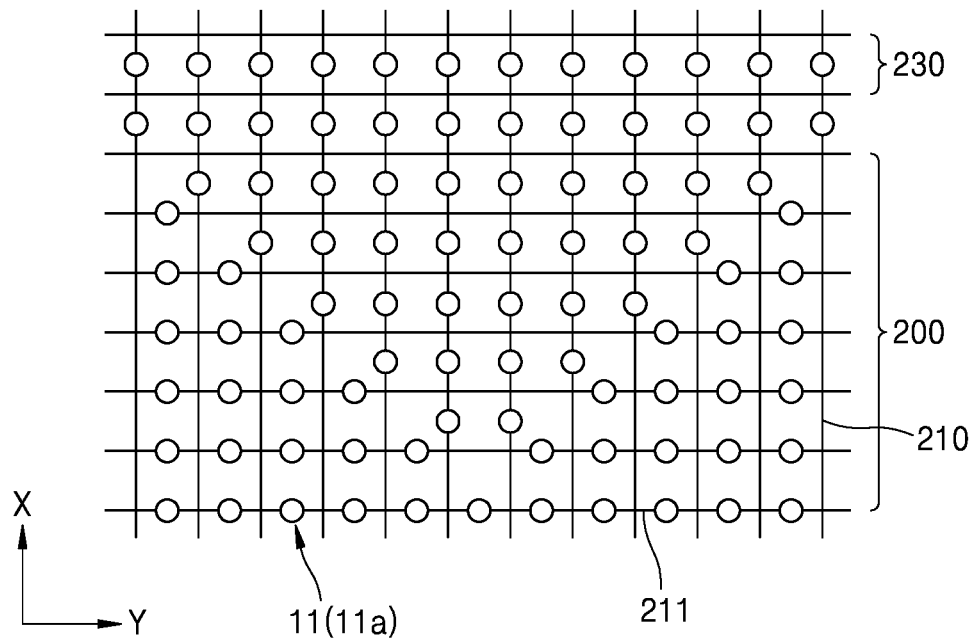
FIGS. 13A to 13C are top plan views showing arrangements of connection wires, branches and protrusions according to other exemplary embodiments of the present inventive concepts.
Figure 13B:
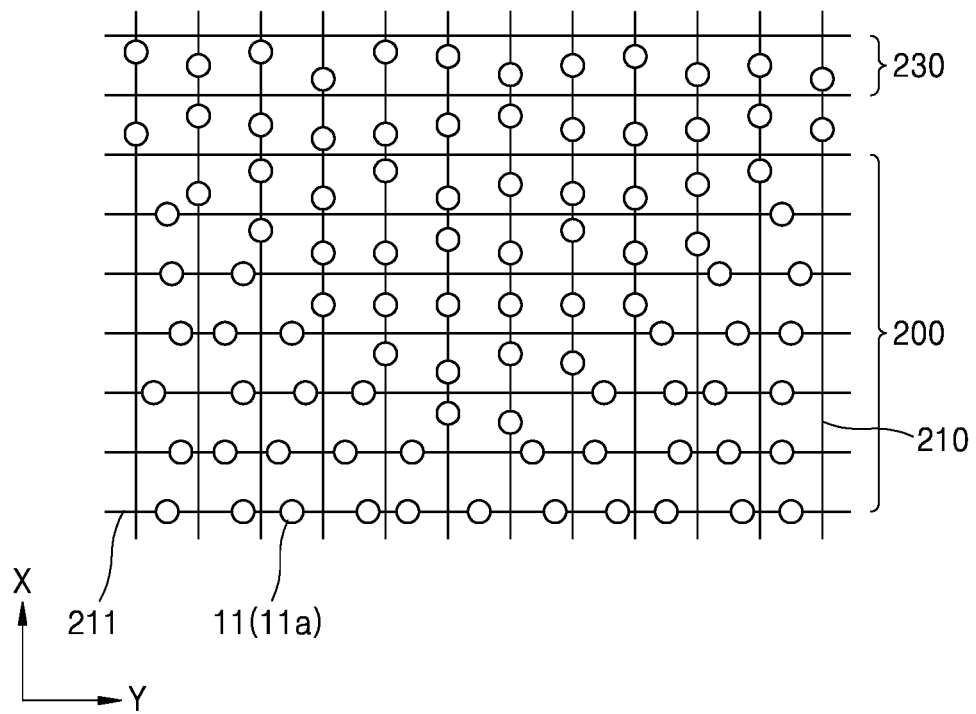

In another exemplary embodiment shown in FIG. 13B, the branches 211 may be formed in an irregular, random pattern in which there is no symmetry in the spacing of branches 211 in adjacent connection wires and the gap 13 may also be irregularly formed. The protrusion 11 (11a) may be disposed in a location corresponding to the gap 13 may also be formed in an irregular random pattern. Since a regular pattern may be more visible to the user, such an irregular distribution of the gap 13 and the protrusion 11 (11a) may further decrease a chance of the user being able to view the reflection pattern of the various wires.

Figure 13C:
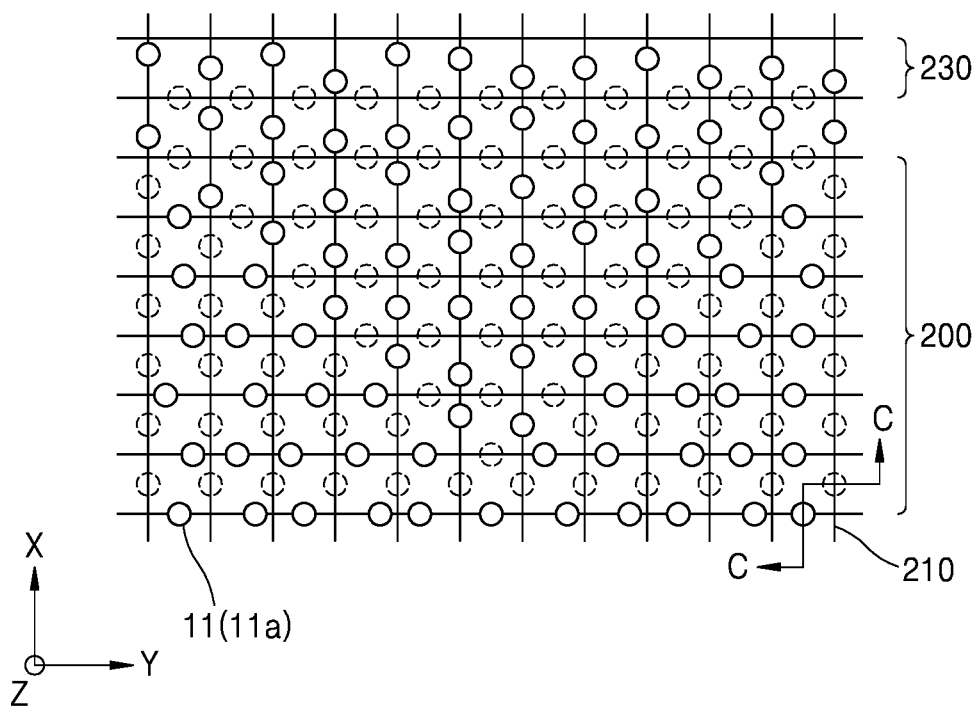
Figure 13D:
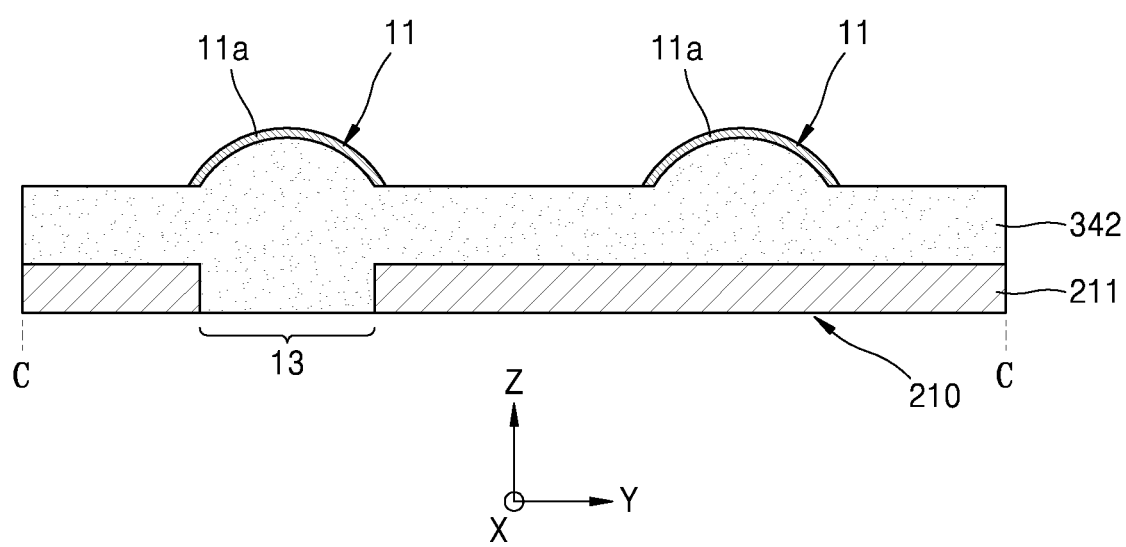
FIG. 13D is a cross-sectional view taken along line C-C' of FIG. 1.3C according to an exemplary embodiment of the present inventive concepts.

Although FIGS. 13A and 13B illustrate the protrusion 11 (11a) formed only in a location corresponding to the gap 13, as shown in FIGS. 13C and 13D, the protrusion 11 (11a) may also be formed on portions of the body 210 of the connection wires (e.g., portions where there is no gap 13).

As a result, protrusions 11 (11a) may be evenly distributed all over the connection wires 200 and the dummy wires 230. Therefore, a regional difference in reflection patterns caused by the presence or absence of the gap 13 and the protrusion 11 (11a) may decrease, and the visibility of a certain regions due to reflection pattern differences may be prevented.

Therefore, the above-described structure allows connection wires to be arranged within a display area a dead zone of the display apparatus may be decreased. Reflection characteristics may become identical or similar over the entire display area thereby effectively preventing or reducing a phenomenon in which reflection patterns of the connection wires cause regions of the connection wires to be clearly visible to the user.

It should be understood that exemplary embodiments described herein should be considered in a descriptive sense only and not for purposes of limitation. Descriptions of features or aspects within each exemplary embodiment should typically be considered as available for other similar features or aspects in other exemplary embodiments. While one or more exemplary embodiments have been described with reference to the figures, it will be understood by those of ordinary skill in the art that various changes in form and details may be made therein without departing from the spirit and scope as defined by the following claims.

What is claimed is:

1. A method of manufacturing a display apparatus, the method comprising:
   forming a plurality of data lines in a display area on a substrate;
   forming a plurality of connection wires in the display area, wherein the plurality of connection wires is connected to the plurality of data lines; and
   covering the plurality of connection wires with an insulating film,
   wherein each of the plurality of connection wires comprises a plurality of branches that diverge from a body of each connection wire,
   wherein the insulating film comprises a protrusion in a gap between adjacent branches of the plurality of branches,
   wherein the adjacent branches of the plurality of branches are electrically isolated from each other.

2. The method of claim 1, wherein
   the plurality of connection wires is arranged in parallel,
   wherein the adjacent branches are distal ends of branches of adjacent connection wires that extend toward each other, and
   wherein the gap is a distance that the distal ends of the branches are spaced apart from each other.

3. The method of claim 1, further comprising:
   covering the protrusion with a metal layer.

4. The method of claim 1, wherein:
   a thickness of a region of the insulating film that includes the protrusion is about 1.5 times to about 2.5 times greater than a thickness of a region of the insulating film that does not include the protrusion.

5. The method of claim 1, wherein
   the gap between the plurality of branches is arranged in a regular pattern,
   wherein the protrusion in the gap is arranged in the regular pattern.

6. The method of claim 1, wherein:
   the gap between the plurality of branches is arranged in an irregular pattern,
   wherein the protrusion corresponds to the gap arranged in the irregular pattern.

7. The method of claim 1, wherein
   the protrusion is further arranged on a portion of the insulating film corresponding to the body of the connection wire adjacent to the gap.

8. A method of manufacturing a display apparatus, the method comprising;
   forming a plurality of data lines in a display area on a substrate;
   forming a plurality of connection wires in the display area, wherein the plurality of connection wires is connected to the plurality of data lines; and
   covering the plurality of connection wires with an insulating film,
   wherein each of the plurality of connection wires comprises a plurality of branches that diverge from a body of each connection wire,
   wherein the insulating film comprises a protrusion in a gap between adjacent branches of the plurality of branches, wherein the plurality of data lines and the plurality of connection wires are arranged on different layers from each other.

9. A method of manufacturing a display apparatus, the method comprising:
   forming a plurality of data lines in a display area on a substrate;
   forming a plurality of connection wires in the display area, wherein the plurality of connection wires is connected to the plurality of data lines; and
   covering the plurality of connection wires with an insulating film,
   wherein each of the plurality of connection wires comprises a plurality of branches that diverge from a body of each connection wire,
   wherein the insulating film comprises a protrusion in a gap between adjacent branches of the plurality of branches, wherein:
   the display area includes a first region and a second region that are adjacent to each other; and
   the plurality of connection wires is arranged on the first region of the display area;
   wherein a plurality of dummy wires is arranged on the same layer as the plurality of connection wires on the second region of the display area.

10. The method of claim 9, wherein the plurality of connection wires comprises a U-shape, and the plurality of dummy wires comprises a straight-line shape.

* * * * *